US012811520B2

(12) United States Patent
Hofmann et al.

(10) Patent No.: US 12,811,520 B2
(45) Date of Patent: Nov. 24, 2026

(54) CONTROL METHOD FOR A MODULAR BRAKING ADJUSTER

(71) Applicant: Innomotics GmbH, Nuremberg (DE)

(72) Inventors: Viktor Hofmann, Bayreuth (DE); Patrick Hofstetter, Erlangen (DE)

(73) Assignee: Innomotics GmbH, Nuremberg (DE)

( * ) Notice: Subject to any disclaimer, the term of this patent is extended or adjusted under 35 U.S.C. 154(b) by 11 days.

(21) Appl. No.: 19/099,681

(22) PCT Filed: Jun. 30, 2023

(86) PCT No.: PCT/EP2023/067993
§ 371 (c)(1),
(2) Date: Jan. 29, 2025

(87) PCT Pub. No.: WO2024/041785
PCT Pub. Date: Feb. 29, 2024

(65) Prior Publication Data

US 2026/0012109 A1 Jan. 8, 2026

(30) Foreign Application Priority Data

Aug. 22, 2022 (EP) ..................................... 22191461

(51) Int. Cl.
*H02P 3/18* (2006.01)
*H03K 17/56* (2006.01)

(52) U.S. Cl.
CPC ............... *H02P 3/18* (2013.01); *H03K 17/56* (2013.01)

(58) Field of Classification Search
CPC .. H02P 3/18; H02P 3/22; H03K 17/56; H03K 17/74; H02M 1/32; H02M 7/4835
See application file for complete search history.

(56) References Cited

U.S. PATENT DOCUMENTS 8,873,258 B2 * 10/2014 Hiller .................... H02M 7/483 363/56.04
9,372,493 B2 * 6/2016 Aiello ................. H02M 7/4835
(Continued)

FOREIGN PATENT DOCUMENTS

DE 10 103 031 A1 7/2002
EP 2 777 127 A1 9/2014
(Continued)

OTHER PUBLICATIONS

Li Zhengxuan et al: "Energy Diverting Converter Topology Using Unidirectional Current H-Bridge Submodules for VSC-HVDC Transmission System", IEEE Transactions on Power Electronics, Institute of Electrical and Electronics Engineers, USA, Bd. 37, Nr. 5, Dec. 9, 2021 (Dec. 9, 2021), Seiten 5299-6308, XP011898442, ISSN: 0885-8993, DOI: 10.1109/TPEL.2021.3133496.
(Continued)

*Primary Examiner* — Kyung S Lee
(74) *Attorney, Agent, or Firm* — Henry M. Feiereisen, LLC

(57) ABSTRACT

A modular braking adjuster having at least one submodule and a braking resistor, which are arranged in a series circuit, are operated by generating with the at least one submodule a square-wave or trapezoidal voltage that has an alternating portion dimensioned such that the time-averaged electrical energy absorbed by the modular braking adjuster is converted to heat in the braking resistor. The modular braking adjuster has a control device for controlling or regulating the at least one submodule. Also disclosed is a modular drive unit with a modular multi-level power converter and the aforementioned modular braking adjuster, wherein the modular braking adjuster is electrically connected to a DC voltage side of the modular multi-level power converter.

17 Claims, 8 Drawing Sheets

(56) References Cited

U.S. PATENT DOCUMENTS

| | | | | |
|---|---|---|---|---|
| 2008/0197966 | A1 | 8/2008 | Sommer | |
| 2008/0259661 | A1* | 10/2008 | Hiller | H02M 7/4835 363/71 |
| 2011/0134667 | A1* | 6/2011 | Hiller | H02M 7/4835 363/55 |
| 2017/0257022 | A1 | 9/2017 | Byrant | |

FOREIGN PATENT DOCUMENTS

| | | | |
|---|---|---|---|
| EP | 2 634 896 | B1 | 5/2016 |
| WO | WO 2007/023081 | A2 | 3/2007 |
| WO | WO 2017/021169 | A1 | 2/2017 |

OTHER PUBLICATIONS

Xu Bin et al: "The State of Art of Energy Consumption Devices for Offshore Wind Power System", 2021 International Conference on Power System Technology (Powercon), IEEE, Dec. 8, 2021 (Dec. 8, 2021), Seiten 1510-1514, XP034080434, DOI: 10.1109/POWERCON53785.2021.9697886.

Cao Shuai et al: "AC and DC fault ride through hybrid MMC integrating wind power", The Journal of Engineering, the Institution of Engineering and Technology, Michael Faraday House, Six Hills Way, Stevenage, Herts. SG1 2AY, UK, Bd. 2017, Nr. 13, Jan. 1, 2017 (Jan. 1, 2017), Seiten 828-833, XP006065959. DOI: 10.1049/JOE.2017.0446.

Cao Shuai et al: "Energy dissipation of MMC-HVDC based onshore wind power integration system with FB-DBS and DCCB", IET Renewable Power Generation, the Institution of Engineering and Technology, Michael Faraday House, Six Hills Way, Stevenage, Herts. SG1 2AY, UK, Bd, 14, Nr. 2, Feb. 3, 2020 (Feb. 3, 2020), Seiten 222-230, XP000088824, ISSN: 1752-1416, DOI: 10.1049/IET-RPG.2019.0491.

Birkel Andre et al: "Analysis and semiconductor based comparison of energy diverting converter topologies for HVDC transmission systems", 2016 17th European Conference on Power Electronics and Applications (EPE'15 ECCE-Europe), Jointly Owned by EPE Association an D IEEE PELS, Sep. 8, 2015 (Sep. 8, 2015), Seiten 1-10, XP032800044, DOI: 10.1109/EPE.2015.7309087.

*PCT International Search Report and Written Opinion of International Searching Authority mailed on Oct. 11, 2023, corresponding to PCT International Application No. PCT/EP2023/067993 filed on Jun. 30, 2023.*

* cited by examiner

CONTROL METHOD FOR A MODULAR BRAKING ADJUSTER

CROSS-REFERENCES TO RELATED APPLICATIONS

This application is the U.S. National Stage of International Application No. PCT/EP2023/067993, filed Jun. 30, 2023, which designated the United States and has been published as International Publication No. WO 2024/041785 A1 and which claims the priority of European Patent Application, Serial No. 22191461.7, filed Aug. 22, 2022, pursuant to 35 U.S.C. 119(a)-(d).

BACKGROUND OF THE INVENTION

The invention relates to a method for operating a modular braking adjuster, said modular braking adjuster comprising at least one submodule and a braking resistor which are arranged in a series circuit. The invention further relates to a control device which is designed to carry out such a method. The invention further relates to a modular braking adjuster, said modular braking adjuster comprising at least one submodule and a braking resistor which are arranged in a series circuit, said modular braking adjuster having such a control device for the purpose of open-loop or closed-loop control of the at least one submodule. The invention further relates to a modular drive unit having a modular multilevel current converter and such a modular braking adjuster, the modular braking adjuster being electrically connected to a DC voltage side of the modular current converter.

A modular multilevel current converter is disclosed in DE 10 103 031 A1. This current converter is also known as M2C or MMC and has a converter topology which, due to the structure comprising submodules, is suitable for medium-voltage and high-voltage applications in particular. The basic structure of the multiphase converter comprises two converter arms per phase, each of which has a series circuit of submodules. Both of the converter arms are connected together at the phase terminal in this case. The other side of the converter arms is connected to the DC voltage side. The AC voltage side of the modular multilevel current converter is formed by one or more phase terminals. Using the basic structure of the converter, energy can be transmitted in both directions between the DC voltage side and the AC voltage side or partly buffered.

In order additionally to allow a selective depletion of energy, the installation of a braking adjuster Is appropriate. A modular braking adjuster is disclosed in WO 2007/023061 A2. The modular braking adjuster is usually connected to the DC voltage side of the modular multilevel current converter, for example between a DC+ and a DC− terminal.

The resistor of a braking adjuster arrangement is often also referred to as a braking resistor because it is suitable for converting electrical energy of an electrical machine into heat, said electrical energy being generated as a result of a braking process. The use of a braking adjuster in this case is not limited to the application of a braking electrical drive. In other words, it is not necessarily limited to the conversion of braking energy into heat. The braking adjuster can also be used for the purpose of stabilizing an energy supply network, for example, by converting electrical energy from the energy supply network into heat. The term braking resistor was chosen so that the resistor in which a predetermined electrical energy or power is converted into heat, or into heat per time, could be distinguished from other resistors.

In the following, a power that must be converted into heat is understood to mean that the integral of the power over the time is converted into heat. In other words, a quantity of energy, which is produced from the power over the time, is converted into heat.

The object of the invention is to improve a modular braking adjuster.

SUMMARY OF THE INVENTION

This object is achieved by a method for operating a modular braking adjuster, said modular braking adjuster comprising at least one submodule and a braking resistor which are arranged in a series circuit, a square-wave or trapezoidal voltage being generated by means of the at least one submodule, said square-wave or trapezoidal voltage having an alternating component which is dimensioned in such a way that the time-averaged electrical energy that is absorbed by the modular braking adjuster is converted into heat in the braking resistor. This object is further achieved by a control device which is designed to carry out such a method. This object is further achieved by a modular braking adjuster, said modular braking adjuster comprising at least one submodule and a braking resistor which are arranged in a series circuit, it being possible to generate a square-wave or trapezoidal voltage by means of the at least one submodule, the modular braking adjuster having such a control device for the purpose of open-loop or closed-loop control of the at least one submodule. This object is further achieved by a modular drive unit, said modular drive unit having a modular multilevel current converter and such a modular braking adjuster, the modular braking adjuster being electrically connected to a DC voltage side of the modular multilevel current converter.

Further advantageous embodiments of the invention are specified in the dependent claims.

The invention is based inter alia on the finding that, by virtue of the modular structure of the modular braking adjuster, all operating voltages of the braking adjuster can be realized. The modular braking adjuster is usually connected to the intermediate circuit of a current converter in order that electrical energy from a drive system or an energy supply system can be converted into heat. By virtue of the modular structure, the modular braking adjuster can be adapted to any level of intermediate circuit voltage by using a corresponding number of submodules.

All known submodule types can be used as submodules in this case. These Include for example half-bridge modules, dual half-bridge modules or also full-bridge modules. The capacitor voltage or capacitor voltages alone of the corresponding submodule can be used for the purpose of generating the voltages. Alternatively, it is also possible for the submodule to generate a voltage which is smaller than the capacitor voltage or capacitor voltages, for example by means of a pulse-width modulation. When using only one submodule in particular, pulse-width modulation has proven advantageous for the purpose of generating different voltages.

Furthermore, the method for operating the modular braking adjuster allows precise open-loop or closed-loop control of the power that is to be converted into heat. The heat is then produced from the temporal integral of the power. According to the method, not all of the intermediate circuit voltage drops when the energy is converted at the braking resistor. This has the advantage that the power that is to be converted into heat can be controlled in a closed-loop manner. At the same time, the energy content of the capacitor or capacitors of the at least one submodule or submodules is controlled in a closed-loop manner. This allows operational stability of the modular braking adjuster, even over extended durations of operation, in particular for continuous operation.

The braking resistor can be arranged at any desired position in the series circuit. For example, the braking resistor can be arranged between one of the terminals of the modular braking adjuster and a submodule, or at any desired position between two submodules.

When the modular braking adjuster is not active, i.e. is not required to convert electrical energy into heat, the voltage that is present over the at least one submodule or the further series circuit of submodules is identical to the intermediate circuit voltage, so that no voltage drops over the resistor and therefore no current flows either.

For the open-loop or closed-loop control, a voltage is generated over the at least one submodule or, if a plurality of submodules are arranged in a further series circuit, over the further series circuit of the submodules. For the open-loop or closed-loop control of the power that is to be converted into heat, a direct component of the voltage is provided. For the closed-loop control of the capacitor voltage or the capacitor voltages of the submodule or submodules, an alternating component is superimposed on the direct component. The superimposition of direct component and alternating component results in a square-wave profile of the voltage. The square-wave profile in turn requires that the voltages over the further series circuit can be changed as rapidly as desired. This leads to an infinite voltage rate of rise. Since these voltages produce corresponding currents, it has proven advantageous to limit the speed of change of the voltage change. As a result of the currents that accompany the voltage changes, the modular braking adjuster is also suitable for braking adjusters which have an inductance, for example as a parasitic inductance of the braking resistor. The square-wave voltage then becomes a trapezoidal voltage.

It has proven advantageous that, with comparatively low amplitudes of both voltage over the further series circuit of the submodules and current flowing through the modular braking adjuster, the square-wave or trapezoidal voltage allows high energies to be exchanged, since the energy is derived from the temporal integral of the current or from the integral of the square of the current. This means that a high power can be achieved. This high power relates to the power that is to be converted into heat and the power that is used to stabilize the submodules. In other words, on the basis of the relatively low amounts of current and voltage, in particular low amplitudes or low maximum values in the current and voltage profiles, it is possible to achieve comparatively high effective values, which are important for a conversion Into heat by the braking resistor. By virtue of the low amplitude or small range of variation resulting from the use of the square-wave or trapezoidal form of the voltage and the associated currents, the semiconductor switches of the submodules can be configured for a lower current load. Alternatively, the modular braking adjuster can be used to convert higher powers into heat.

The square-wave or trapezoidal voltage can easily be generated by a control device which activates the semiconductor switches of the submodule or the submodules of the further series circuit.

It is particularly advantageous to combine the modular braking adjuster with the modular multilevel current converter, also referred to as an M2C current converter, thus forming a modular drive unit. Structurally identical submodules can be deployed for both the modular multilevel current converter and the modular braking adjuster in this case. Likewise, the same hardware can be used for the open-loop control of the submodules. By virtue of the modular structure of both current converter and modular braking adjuster, the modular drive unit can easily be adapted to an actual power requirement by selecting a corresponding number of submodules in the current converter and in the modular braking adjuster. As a result of the structurally identical embodiment of the submodules in both modular braking adjuster and multilevel current converter, a high proportion of shared components can be achieved. This has a positive effect on the reliability and the production costs of such a drive unit.

The modular braking adjuster can be connected to the DC voltage side of current converters of any chosen design, and is not limited to use with a modular multilevel current converter.

In this case, the square-wave or trapezoidal voltage has an alternating component which is dimensioned in such a way that the time-averaged electrical energy absorbed by the modular braking adjuster is converted into heat in the braking resistor. The alternating component can be used to influence the capacitor voltages of the submodules and to stabilize the modular braking adjuster. By means of a corresponding voltage drop over the braking resistor, the alternating component of the voltage results in a further alternating component in the current through the modular braking adjuster. Both the alternating component and the further alternating component have an average value of zero in this case, and therefore only reactive power is exchanged using the further alternating component of the current and the intermediate circuit voltage or the voltage over the modular braking adjuster. It has advantageously been shown that this component can be used to exchange energy between the capacitors of the submodules and the resistor. In this case, the exchange of energy is advantageously controlled in an open-loop or closed-loop manner such that the total effective power over the resistor is converted into heat. In this case, the time-averaged electrical energy absorbed by the modular braking adjuster is converted into heat in the braking resistor. The relationship expressed as an equation in this case gives $$P_{BR} = U_D \cdot i_{BR,DC} = R \cdot i_{BR,eff}^2, \tag{2}$$

where the current $i_{BR}$ through the braking resistor is composed of the direct component $i_{BR,DC}$ and the alternating component $i_{BR,aDC}$ in accordance with $$i_{BR} = i_{BR,DC} + i_{BR,aDC}. \tag{3}$$

If equation (3) is inserted into equation (2), the resulting equation can be solved according to $i_{BR,aDC}$. The square-wave or trapezoidal voltage waveform can be taken into consideration in this way. In the simple and idealized case of a square-wave voltage or current form, the alternating component of the current is given as $$|i_{BR,aDC}| = \sqrt{\left(\frac{U_D}{R} - i_{BR,DC}\right) \cdot i_{BR,DC}}\,. \tag{4}$$

In order that the average value of the current $i_{BR,aDC}$ over the time is equal to zero, the alternating component is the component having the value according to equation (4) for half of the time and the corresponding value with a negative operational sign for the other half of the time. The resistance R must be correspondingly small for the formula (4) to deliver a positive value.

In order to generate this current, the alternating component of the voltage over the further series circuit of submodules has the value $$|u_{BR,aDC}| = R \cdot |i_{BR,aDC}| = R \cdot \hat{i}_{BR,aDC}. \quad (5)$$

In order that the alternating component has an average value of zero over time with this voltage likewise, the value calculated above is set as an alternating component for half of the time and the corresponding negative value for the remaining half of the time.

In an advantageous embodiment of the invention, the modular braking adjuster comprises a multiplicity of submodules which are arranged in a further series circuit, the square-wave or trapezoidal voltage over the further series circuit of the submodules being generated by means of the multiplicity of submodules. By virtue of using a multiplicity of submodules in the further series circuit, the operating voltage of the modular braking adjuster can be adapted as desired to the intermediate circuit voltage of the current converter. It is possible in this way to realize any desired level of operating voltage, i.e. intermediate circuit voltage, in the drive unit.

In a further advantageous embodiment of the invention, the square-wave or trapezoidal voltage has a direct component, this direct component being controlled in an open-loop or closed-loop manner as a function of the power that is to be converted into heat by the modular braking adjuster or as a function of the voltage that is present at the modular braking adjuster. The direct component of the voltage can generate a current through the modular braking adjuster, which current also has a further direct component. This direct component flows through the modular braking adjuster and therefore the braking resistor likewise. In this case, the current flowing through the braking resistor generates electrical losses. These are used specifically to convert electrical energy into heat. The level of the power that is to be converted into heat, i.e. the energy per time unit, can be controlled in an open-loop or closed-loop manner by the level of the direct component of the voltage, since this directly influences the voltage dropping over the resistor and consequently also the further direct component of the current through the modular braking adjuster. It has therefore proven advantageous to control, in an open-loop or closed-loop manner, the direct component as a function of the power that is to be converted into heat. In this case, said power can also depend on other variables such as for example the voltage of the capacitor of the submodules of a modular multilevel current converter. If the modular braking adjuster is operated at an intermediate circuit having intermediate circuit capacitors, for example a 2-position or 3-position current converter, it has proven advantageous to control, in an open-loop or closed-loop manner, the direct component as a function of the intermediate circuit voltage. Using such closed-loop control structures, it is possible to realize dynamic closed-loop controls for converting electrical power into heat, which protect the electrical drive unit against overload from excessive amounts of energy. Said energy amounts can be produced from the braking process of an electrical machine, for example.

In a further advantageous embodiment of the invention, the direct component is controlled in an open-loop or closed-loop manner in such a way that a current having a further direct component through the modular braking adjuster is generated, the product of the further direct component and the voltage over the modular braking adjuster corresponding to a predetermined power that is to be converted into heat by the modular braking adjuster, in particular to a predetermined effective power that is to be converted into heat by the modular braking adjuster. In this case, the voltage level of the direct component of the voltage is controlled in an open-loop or closed-loop manner in such a way that the further direct component of the current has such a magnitude that the product of the intermediate circuit voltage and the further direct component corresponds to the value of the power that is to be converted into heat by the modular braking adjuster. The power that is to be converted into heat is an energy which is converted into heat in a specified time. The intermediate circuit voltage is present over the modular braking adjuster since this is electrically connected to the intermediate circuit. Therefore the intermediate circuit voltage is present over the series circuit comprising braking resistor and the further series circuit of the submodules. As an alternative to the further series circuit of submodules, there may also be only one submodule. The modular braking adjuster at which the intermediate circuit voltage is present therefore absorbs the effective power $$P_{BR} = U_D \cdot i_{BR,DC}. \quad (1)$$

The total effective power absorbed by the braking resistor should be converted into heat, since the modular braking adjuster should not be designed to absorb and store significant amounts of energy. The difference in the voltage between the square-wave and trapezoidal waveform can be controlled in a closed-loop manner by means of for example a PI controller, such that a predeterminable voltage is obtained in the submodules at the capacitor or capacitors. In other words, a further voltage component for achieving the square-wave or trapezoidal voltage can be generated as a function of the voltage at the capacitor or capacitors of the submodules, which controls the voltage at the capacitors of the submodules in a closed-loop or open-loop manner with the aid of a PI controller, for example. Alternatively or additionally, it is also possible to influence the voltage at the capacitors of the submodules by means of the voltage rate of rise of the trapezoidal form and/or using the frequency of the trapezoidal or square-wave form.

In a further advantageous embodiment of the Invention, the alternating component is used as a control variable for closed-loop control of the capacitor voltages of the submodules. In order that interferences can be managed, it has proven advantageous to use the values of the alternating component determined according to the formulas for the purpose of advance control. The voltage at the capacitors is then controlled in a closed-loop manner by means of a closed loop control. Therefore stable operation of the modular braking adjuster is also possible when interference variables are present. Moreover, operation is unaffected by changing variables. For example, a change in the resistance value due to ageing or heating can be compensated without difficulty by means of the closed-loop control.

In a further advantageous embodiment of the invention, an AC voltage side of the modular multilevel current converter is connected to an energy source, in particular an energy supply network or an electrical machine. By virtue of the connection to an energy source, the modular braking adjuster can be used to convert surplus or unusable energy into heat. The energy source can be for example an electrical machine which feeds electrical energy back during a braking operation. If this cannot be reused, it must be converted into heat by means of the modular braking adjuster if mechanical braking is not to be used. The conversion of the electrical energy into heat takes place without wear, unlike mechanical braking, and therefore the use of the modular braking adjuster is more economical in operation.

The modular multilevel current converter can also be used for the transmission of energy. In this case, it can be helpful to provide a modular braking adjuster in case the transmitted energy cannot be accepted. This ensures that such an energy transmission continues to operate, even if the reception of energy is disrupted. The energy transmission system can remain operational during the disruption and it is possible reliably to avoid a costly shutdown and restart, which can also lead to stability problems in the energy supply network. This means that the modular braking adjuster also increases the reliability and availability of a modular drive unit which is provided for the transmission of energy.

In a further advantageous embodiment of the invention, the control device of the modular drive unit is designed to determine the power that is to be converted into heat as a function of the voltage of the capacitor of the submodules of the modular multilevel current converter. In the case of a modular multilevel current converter, an energy that is stored in the current converter is not necessarily, as in the case of a 2-position or 3-position current converter for example, evident at the intermediate circuit voltage. In the case of the modular multilevel current converter, an increased energy content has an effect on the stored energy, i.e. the voltage, of the capacitor or the capacitors in the respective submodules of the modular multilevel current converter. In order selectively to reduce the energy content in the modular multilevel current converter, it has proven advantageous to determine the power that is to be converted into heat for the open-loop or closed-loop control of the direct component as a function of the voltage of the capacitor of the respective submodules of the modular multilevel current converter. A possible method for operating an electrical drive unit having a modular current converter and a proposed modular braking adjuster controls the direct component of the voltage over the further series circuit of the submodules of the modular braking adjuster in a closed-loop or open-loop manner as a function of the voltage of the capacitor or the capacitors of the submodules of the modular multilevel current converter.

BRIEF DESCRIPTION OF THE DRAWING

The invention is described and explained in greater detail below with reference to the exemplary embodiments illustrated in the figures, in which.

DETAILED DESCRIPTION OF PREFERRED EMBODIMENTS

Figure 1:
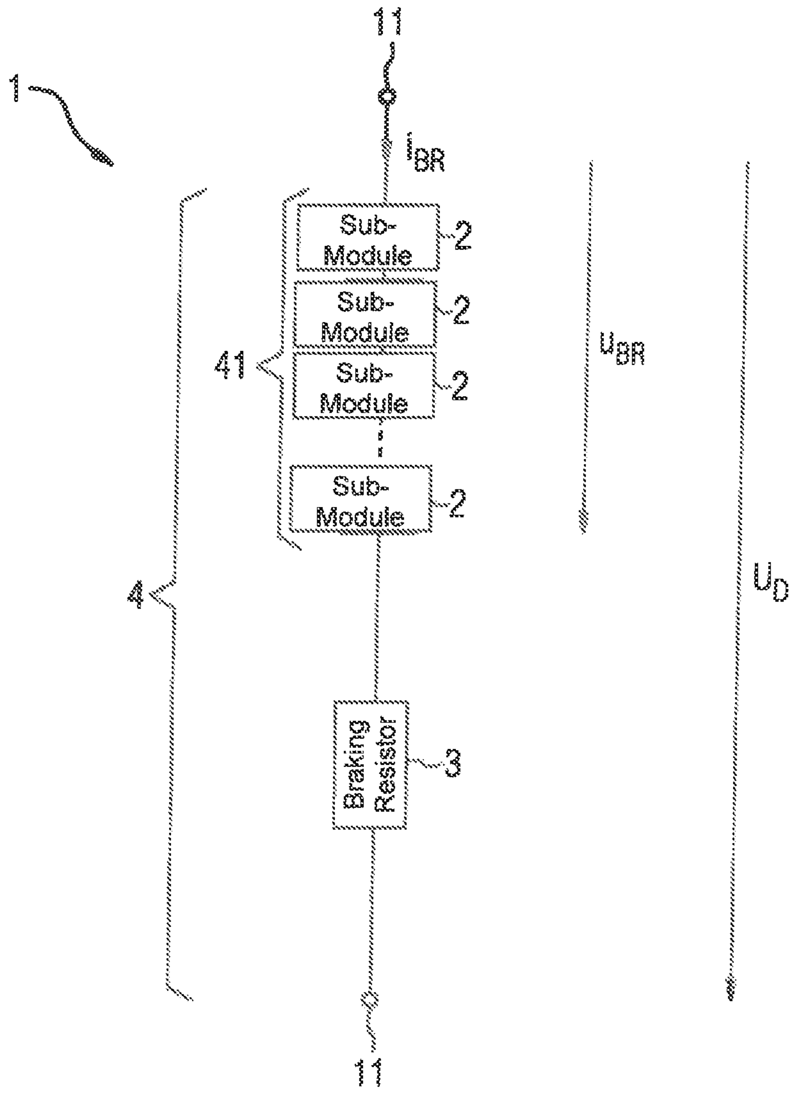
FIG. 1 shows a modular braking adjuster.

FIG. 1 shows a modular braking adjuster 1. This has a series circuit 4 comprising at least one submodule 2 and a braking resistor 3. The series circuit 4 can have a multiplicity of submodules 2. These are in turn, as part of the series circuit 4, arranged in a further series circuit 41. The modular braking adjuster 1 is designed to be connected at its terminals 11 to an intermediate circuit 9 of a current converter.

A voltage $u_{BR}$ over the further series circuit 41 of the submodules can be generated with the aid of a control device 10. A current $i_{BR}$ through the modular braking adjuster 1 can be produced by the voltage $u_{BR}$. The current $i_{BR}$ also flows through the braking resistor 3 and causes the conversion of electrical energy into heat. The operating voltage $U_D$ is present over the modular braking adjuster 1. If the modular braking adjuster 1 is connected to the intermediate circuit of a current converter, the intermediate circuit voltage is present at the modular braking adjuster. In this case, it is said that the modular braking adjuster 1 is connected to the DC voltage side of the current converter.

Figure 2:
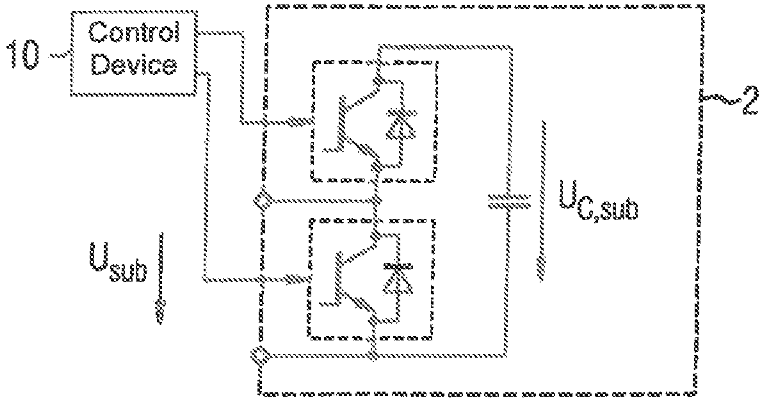
FIG. 2 to FIG. 4 show exemplary embodiments of the submodule.
Figure 3:
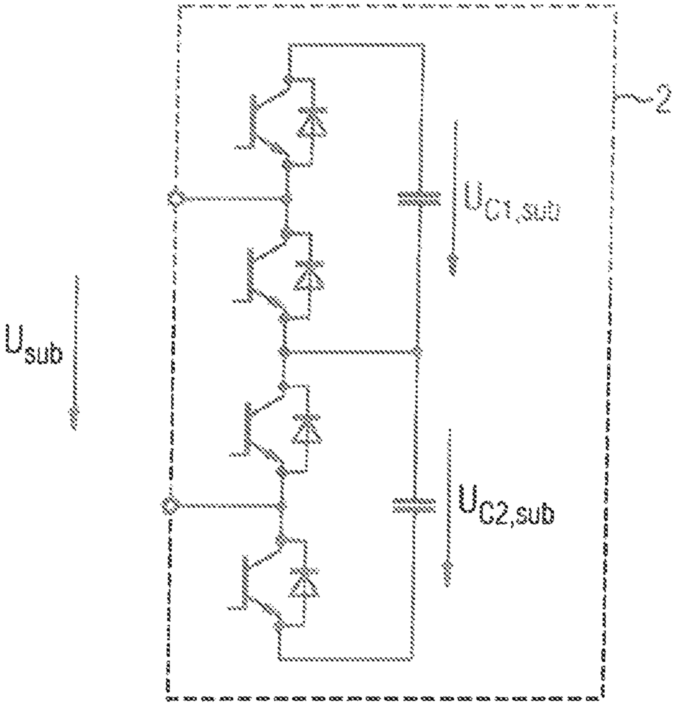
Figure 4:
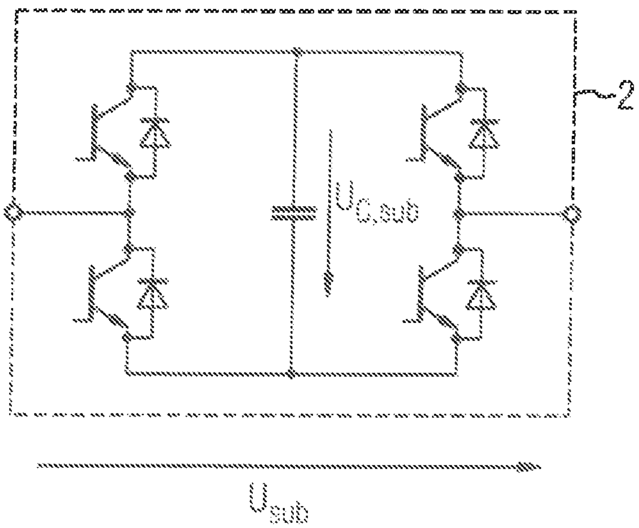

FIGS. 2 to 4 show exemplary embodiments of submodules 2. All known submodules, in particular the submodules in FIGS. 2 to 4, are suitable for the purpose of carrying out the proposed method. In order to avoid repetition, reference is made to the description for FIG. 1 and the reference signs assigned there.

The illustrated exemplary embodiments of the submodules 2 comprise at least two semiconductor switches and at least one capacitor. By means of switching operations of the semiconductor switches, it is possible to generate an output voltage $U_{sub}$ at the terminals of the submodule 2. In this case, a control device 10 sends the activation signals to the semiconductor switches of the submodule 2. The control device 10 is preferably located outside the submodule 2 and is therefore not part of the submodule. Rather, it has proven advantageous to activate all submodules 2 of the modular braking adjuster 1 via one control device 10. Furthermore, the control device 10 can perform the necessary calculations for the open-loop and closed loop control of the voltages and currents. Thus the control device 10 can specify the required current through the modular braking adjuster $i_{BR}$ on the basis of the predetermined value of the power that is to be converted into heat. In order to generate this current $i_{BR}$, a voltage over the submodules of the further series circuit 41, determined and controlled in an open-loop or closed-loop manner by the control device 10, is generated by means of corresponding activation signals. For clarity, the illustration of the control device 10 has been omitted in the following exemplary embodiments.

FIG. 2 shows a so-called half-bridge module. This has two semiconductor switches and one capacitor. The voltage $U_{C,sub}$ is present at the capacitor. By means of switching operations in the semiconductor switches, it is possible to generate the output voltage $U_{sub}$ of zero or $U_{C,sub}$ at the terminals of the submodule 2.

FIG. 3 shows a so-called dual half-bridge module. This has four semiconductor switches and two capacitors. The voltage $U_{C1,sub}$ or $U_{C2,sub}$ is present at the respective capacitors. By means of switching operations in the semiconductor switches, it is possible to generate the output voltage $U_{sub}$ of zero, one of the capacitor voltages $U_{C1,sub}$, $U_{C2,sub}$ or the sum of the capacitor voltages $U_{C1,sub}$, $U_{C2,sub}$ at the terminals of the submodule 2.

FIG. 4 shows a so-called full-bridge module. This has four semiconductor switches and one capacitor. The voltage $U_{C,sub}$ is present at the capacitor. By means of switching operations in the semiconductor switches, it is possible to generate the output voltage $U_{sub}$ of zero, the positive or the negative capacitor voltage $\pm U_{C,sub}$ at the terminals of the submodule 2.

Figure 5:
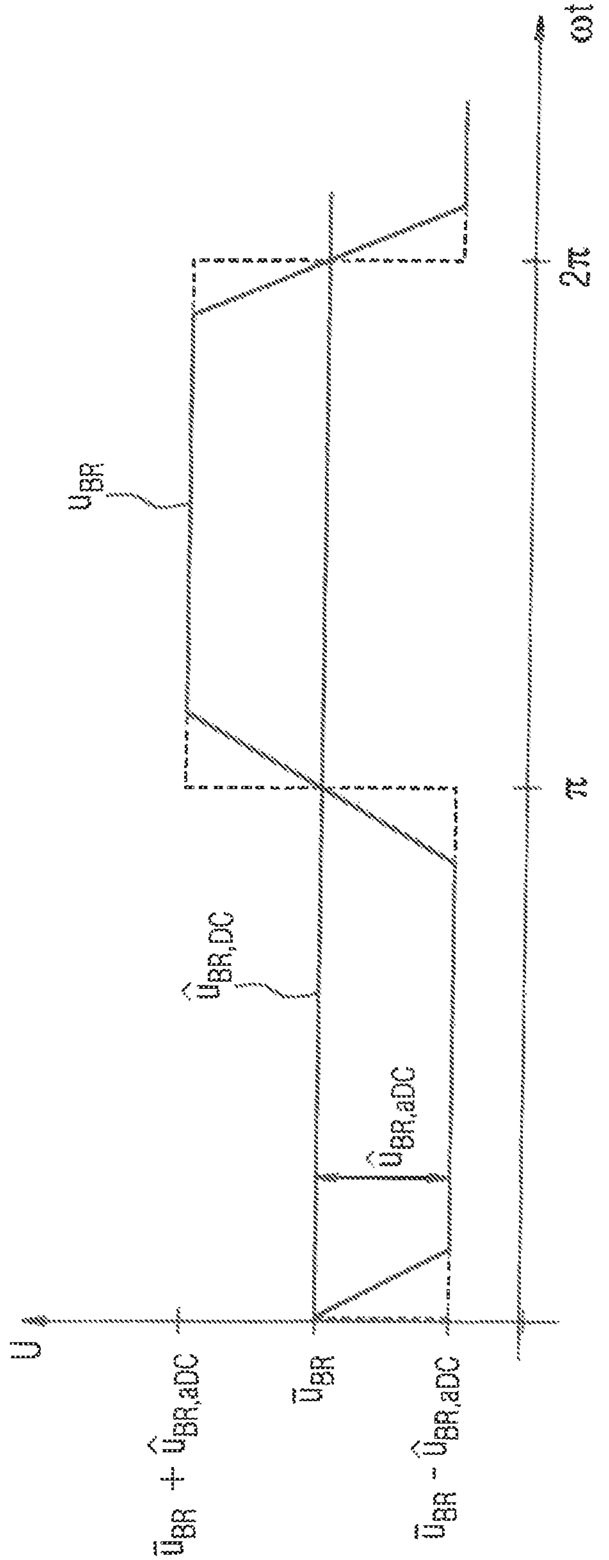
FIG. 5 to FIG. 8 show time profiles of voltage and current.

FIG. 5 shows the temporal profile of the voltage $u_{BR}$ over the submodules 2 of the further series circuit 41 for the proposed method. In order to avoid repetition, reference is made to the description for FIGS. 1 to 4 and the reference signs applied there. The voltage $u_{BR}$ is composed of a direct component $u_{BR,DC}$ and an alternating component $u_{BR,aDC}$, the alternating component assuming the value $+\hat{u}_{BR,aDC}$ and $-\hat{u}_{BR,aDC}$ for half of a switching period in each case. This means that the alternating component $u_{BR,aDC}$ does not have a direct component and therefore has no average. The superimposition of direct component $u_{BR,DC}$ and alternating component $u_{BR,aDC}$ produces the voltage $u_{BR}$. As a result of a finite voltage rate of rise of the alternating component, which changes its value in the form of a ramp, a trapezoidal voltage profile is produced for the voltage $u_{BR}$. If a high or ideally infinite edge steepness is set, this produces the broken-marked profile in the transition zone and hence a square-wave voltage waveform of the voltage $u_{BR}$.

Figure 6:
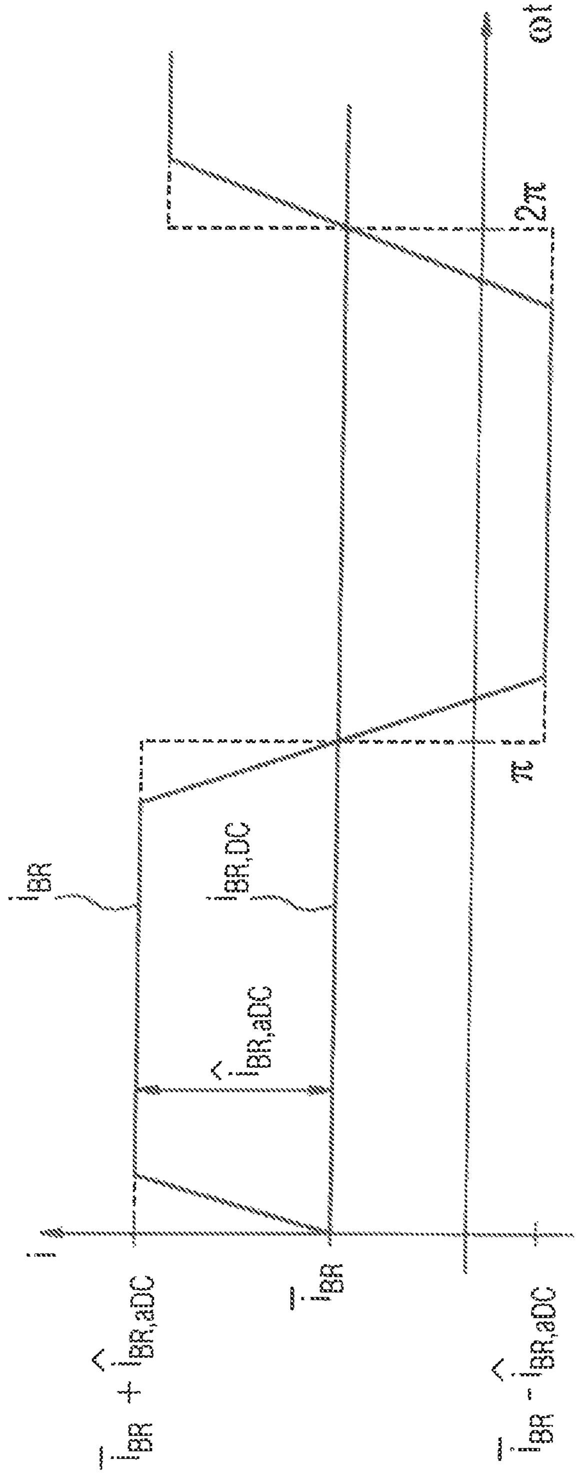

By way of example, FIG. 6 shows the current profile $i_{BR}$, which is produced by the voltage profile in FIG. 5, through the modular braking adjuster 1. The voltage $u_{BR}$ produces a voltage over the braking resistor 3 which results in a current $i_{BR}$ having a further direct component $i_{BR,DC}$ and a further alternating component $i_{BR,aDC}$. In order to distinguish these from the direct component and alternating component of the voltage, the direct component and alternating component of the current are designated as further direct component and further alternating component respectively.

During the time in which the voltage over the submodules 2 in the further series circuit 41 is low, a greater voltage drops over the braking resistor 4, and therefore a greater current $i_{BR}$ is produced through the modular braking adjuster 1 and vice versa. In this way, the current $i_{BR}$ through the braking resistor 3 can be negative temporarily as a function of the level of the alternating component $u_{BR,aDC}$. In other words, depending on the operating point, the amount of the alternating component can become greater than the direct component. When using unipolar submodules which can only assume one polarity in their output voltage $U_{sub}$, for example halfbridges or dual halfbridges, the current $i_{BR}$ through the modular braking adjuster 1 assumes a negative value at its minimum.

Figure 7:
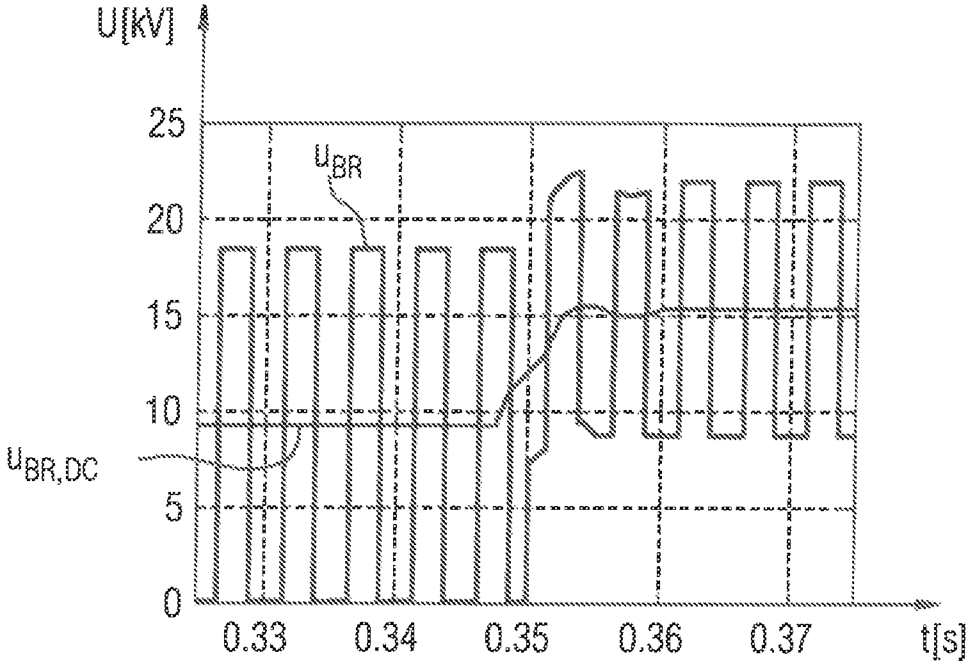

FIG. 7 shows the profile of the voltage $u_{BR}$ at the further series circuit 41 of the submodules 2 of the modular braking adjuster 1 for an application in the mid-voltage range. The mid-voltage range starts from a voltage of 1000 V, also expressed as 1 kV. An alternating component $u_{BR,aDC}$ is superimposed on the direct component $u_{BR,DC}$ in such a way as to produce the voltage profile of the voltage $u_{BR}$. In this case, the value of the power that is to be converted into heat changes between the time points t=0.34 s and t=0.36 s. This power is reduced in the profile shown. This value is specified to the modular braking adjuster 1 or the control device 10 thereof. For example, this value can be derived from the voltage of the intermediate circuit $U_D$ to which the modular braking adjuster is attached or, generally expressed, from the voltage that is present at the terminals 11 of the modular braking adjuster 1. Equally, the value can also be determined as a function of the voltage at the capacitor or capacitors of the submodules of a modular multilevel current converter that is connected to the modular braking adjuster 1. The modular braking adjuster 1 with the control device 10 reacts to this by increasing the direct component $u_{BR,DC}$. At the same time, it is evident that the smaller range of variation of the voltage $u_{BR}$ is accompanied by a smaller alternating component $u_{BR,aDC}$. This alternating component $u_{BR,aDC}$ stabilizes the capacitor voltages $U_C$ of the capacitors of the submodules 2.

Figure 8:
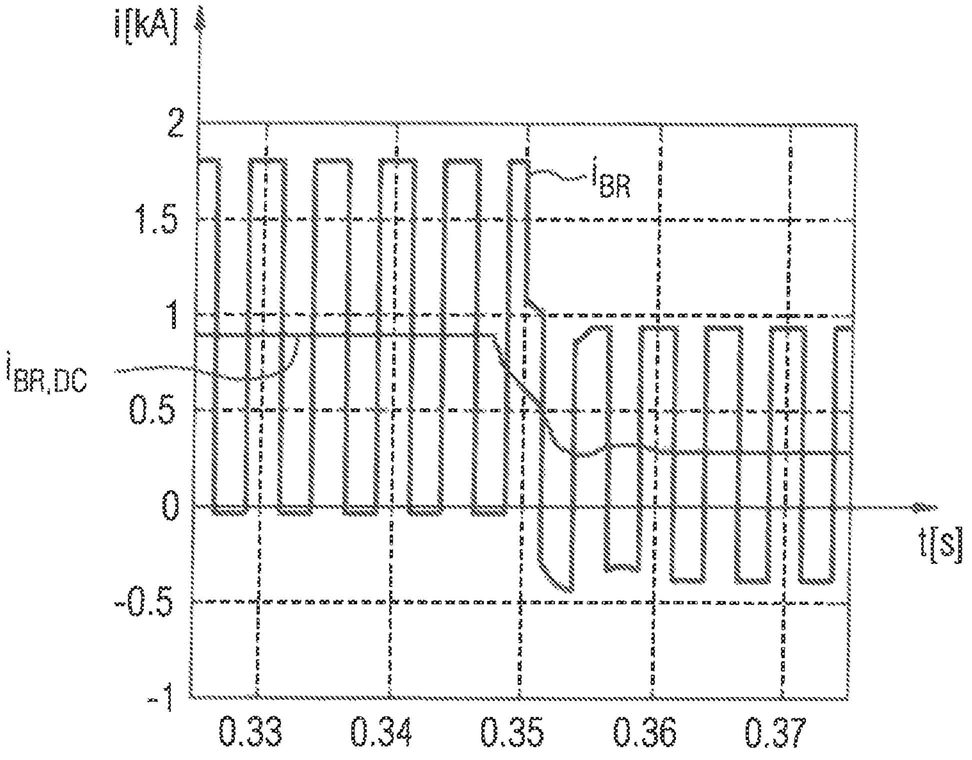

FIG. 8 shows the associated profile of the current $i_{BR}$ through the modular braking adjuster with its further direct component $i_{BR,DC}$. The reduction of the power can be seen in the smaller current. Moreover, after the time point t=0.35 s, an operating point occurs at which the current $i_{BR}$ temporarily assumes a negative value. At the time points before t=0.35 s, the current at its minimum is only just recognizable as negative.

The time profiles in FIG. 7 and FIG. 8 have such high speeds of change that the time profiles can be described as square-wave time profiles.

Figure 9:
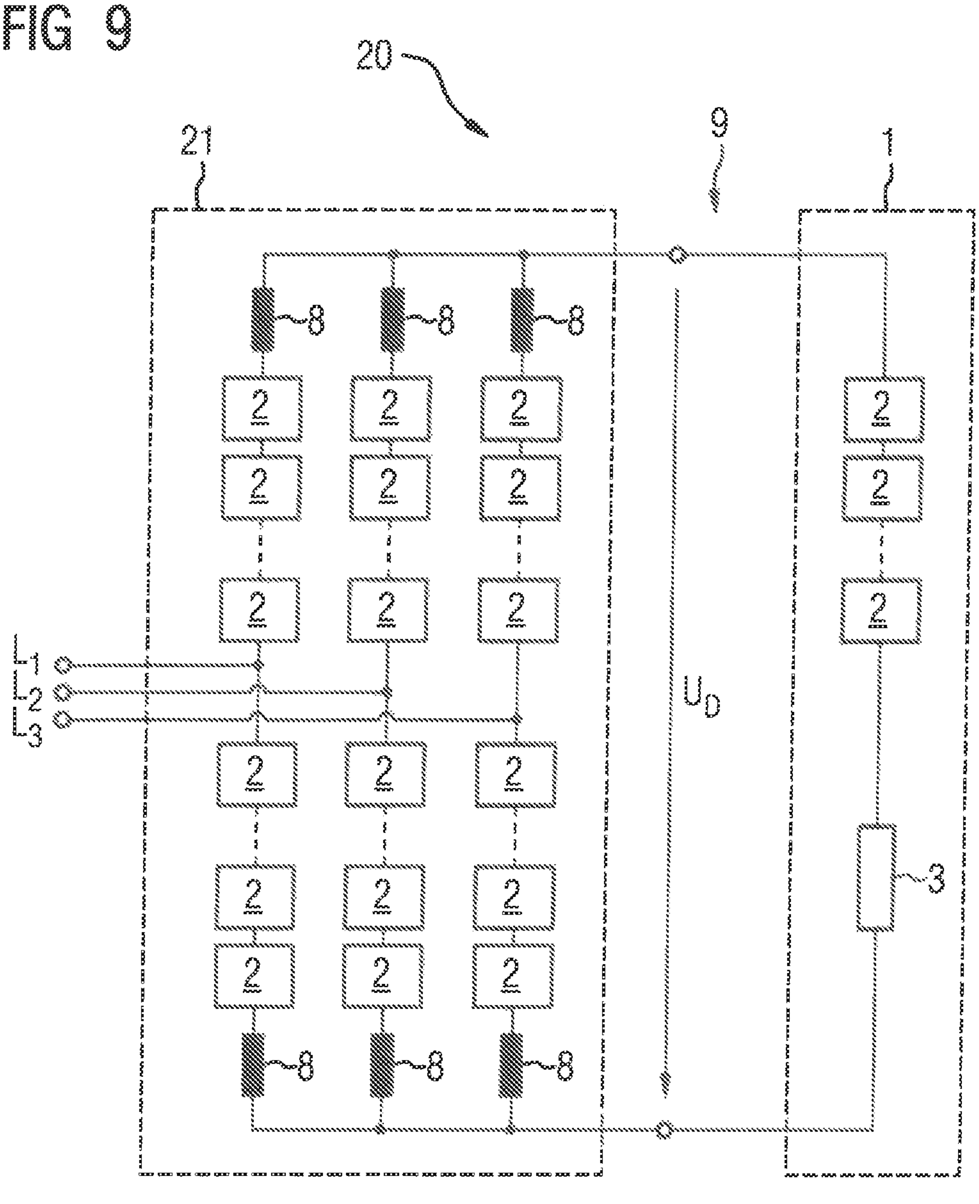
FIG. 9 to FIG. 11 show exemplary embodiments of the modular drive unit.

FIG. 9 shows a modular drive unit 20 with a modular multilevel current converter 21 and a modular braking adjuster 1. These are interconnected via the intermediate circuit 9, at which the voltage $U_D$ is present. In this case, the modular multilevel current converter 21 can have but need not have the same submodules 2 as the modular braking adjuster 1. The series circuit of the submodules 2 of the modular multilevel current converter 21 additionally has an inductance 8, which improves the control response of the modular multilevel current converter 21. The terminals L1, L2, L3 represent the AC voltage side terminals or simply the AC voltage side of the modular multilevel current converter 21. In this exemplary embodiment, the modular multilevel current converter 21 is three-phase. Alternatively, a single-phase embodiment with a neutral conductor, or indeed any desired number of phases, can also be achieved by providing a corresponding number of phase modules in the modular multilevel current converter 21.

Figure 10:
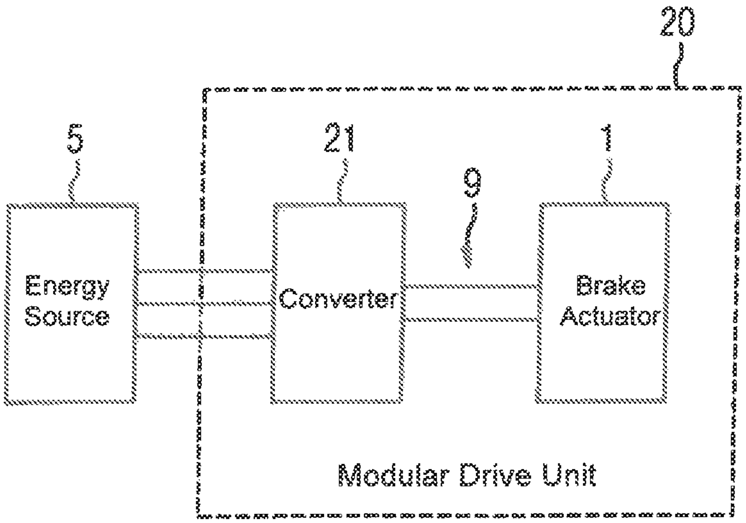

FIG. 10 shows an exemplary embodiment of a modular drive unit 20. In this case, an energy source 5 is electrically connected to the AC voltage side of the modular multilevel current converter 21. The energy source can be for example an energy supply network 6 or an electrical machine 7.

Figure 11:
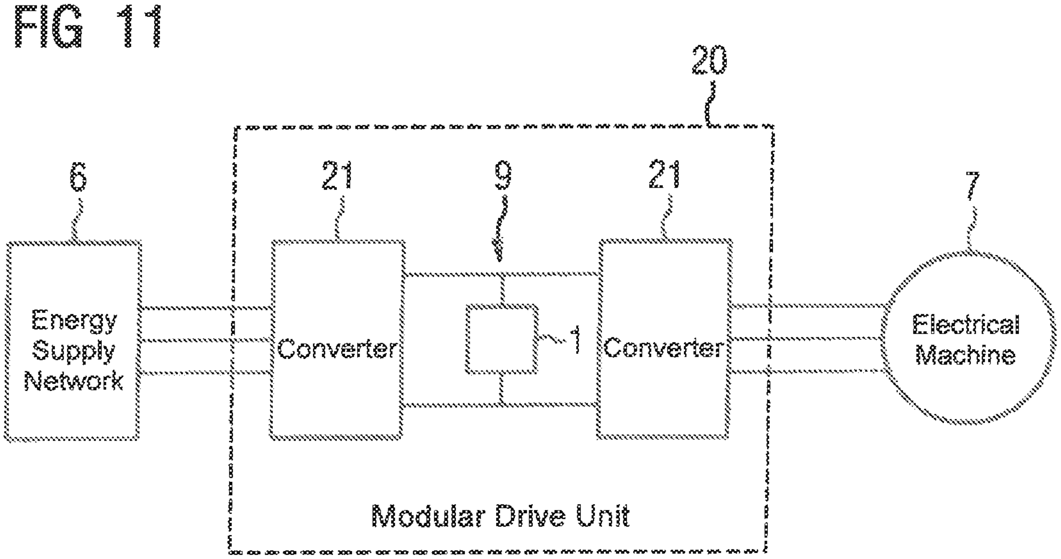

In the exemplary embodiment in FIG. 11, the modular drive unit 20 has two modular multilevel current converters 21 and a modular braking adjuster 1, these being electrically interconnected at the intermediate circuit 9. In this case, a first of the two modular multilevel current converters 21 is connected at its AC voltage side to an energy supply network 6 and a second of the two modular multilevel current converters 21 is connected at its AC voltage side to an electrical machine 7. The electrical machine 7 can be supplied with electrical energy from the energy supply network 6 in this case. A return feed of energy from the electrical machine 7 into the energy supply network 6 for example during a braking process is also possible using the modular drive unit 20. If the energy supply network 6 is not able to receive this, the electrical energy that is generated by the electrical machine 7 can advantageously be converted into heat by means of the modular braking adjuster 1. In this embodiment, it is possible to dispense with a mechanical brake which is subject to wear.

In summary, the invention relates to a method for operating a modular braking adjuster 1, said modular braking adjuster 1 comprising at least one submodule 2 and a braking resistor 3 which are arranged in a series circuit 4. In order to improve the function of the modular braking adjuster, it is proposed that a square-wave or trapezoidal voltage $u_{BR}$ is generated by means of the at least one submodule 1, said square-wave or trapezoidal voltage $u_{BR}$ having an alternating component $u_{BR,aDC}$ which is dimensioned in such a way that the time-averaged electrical energy absorbed by the modular braking adjuster 1 is converted into heat in the braking resistor 3. The Invention also relates to a control device 10 which is designed to carry out such a method. The invention further relates to a modular braking adjuster 1, said modular braking adjuster 1 comprising at least one submodule 2 and a braking resistor 3 which are arranged in a series circuit 4, it being possible to generate a square-wave or trapezoidal voltage $u_{BR}$ by means of the at least one submodule 1, said modular braking adjuster 1 having such a control device 10 for the purpose of open-loop or closed-loop control of the at least one submodule 2. The invention further relates to a modular drive unit 20 having a modular multilevel current converter 21 and such a modular braking adjuster 1, the modular braking adjuster 1 being electrically connected to a DC voltage side of the modular multilevel current converter 21.

The invention claimed is:

1. A method for operating a modular braking adjuster having at least one submodule and a braking resistor arranged in a series circuit, wherein the at least one submodule comprises at least two controllable semiconductor switches and at least one capacitor, the method comprising:

generating with the at least one submodule a square-wave voltage or a trapezoidal voltage having an alternating voltage component which is free of a direct voltage component and dimensioned in such a way that a time-averaged electrical energy absorbed by the modular braking adjuster is converted into heat in the braking resistor, and selecting a resistance value R of the braking resistor to be small enough, such that the formula $$|i_{BR,aDC}| = \sqrt{\left(\frac{U_D}{R} - i_{BR,DC}\right) \cdot i_{BR,DC}}$$

provides a positive value.

2. The method of claim 1, wherein each of the at least one submodule is designed as a unipolar submodule, further comprising generating with the modular braking adjuster a current that is temporarily negative.

3. The method of claim 1, wherein the braking resistor is dimensioned such that a current through the modular braking adjuster is temporarily negative.

4. The method of claim 1, wherein the modular braking adjuster comprises a plurality of unipolar submodules which are arranged in a further series circuit and generate the square-wave voltage or the trapezoidal voltage across the further series circuit.

5. The method of claim 1, wherein the direct component is controlled in an open-loop or closed-loop manner as a function of power to be converted into heat in the modular braking adjuster or as a function of the voltage across the modular braking adjuster.

6. The method of claim 5, wherein the direct component is controlled in an open-loop or closed-loop manner so as to generate a current through the modular braking adjuster having a further direct component, wherein a product of the further direct component and the voltage across the modular braking adjuster corresponds to a predetermined power that is to be converted into heat by the modular braking adjuster.

7. The method of claim 6, wherein the predetermined power is an effective power.

8. The method of claim 1, further comprising controlling capacitor voltages of the at least one submodule in a closed-loop control using the alternating voltage component as a control variable.

9. A control device configured to carry out the method as set forth in claim 1.

10. A modular braking adjuster, comprising:

at least one submodule and a braking resistor arranged in a series circuit, the at least one submodule comprising at least two controllable semiconductor switches and at least one capacitor and configured to generate a square-wave voltage or a trapezoidal voltage, a control device operatively connected to the at least one submodule for open-loop or closed-loop control of the at least one submodule and configured to generate with the at least one submodule a square-wave voltage or a trapezoidal voltage having an alternating voltage component which is free of a direct voltage component and dimensioned in such a way that the time-averaged electrical energy absorbed by the modular brake actuator is converted into heat in the braking resistor, wherein the braking resistor has a resistance value R selected to be small enough, such that the formula $$|i_{BR,aDC}| = \sqrt{\left(\frac{U_D}{R} - i_{BR,DC}\right) \cdot i_{BR,DC}}$$

provides a positive value.

11. The modular braking adjuster of claim 10, wherein each of the at least one submodule is designed as a unipolar submodule, wherein the control device is configured to generate a current through the modular braking adjuster that is temporarily negative.

12. The modular braking adjuster of claim 10, wherein the braking resistor is dimensioned such that a current through the modular braking adjuster is temporarily negative.

13. The modular braking adjuster of claim 10, wherein the modular braking adjuster comprises a plurality of submodules which are arranged in a further series circuit and generate the square-wave voltage or the trapezoidal voltage across the further series circuit.

14. A modular drive unit, comprising:

a modular multilevel current converter, a modular braking adjuster comprising at least one submodule and a braking resistor arranged in a series circuit, the at least one submodule comprising at least two controllable semiconductor switches and at least one capacitor and configured to generate a square-wave voltage or a trapezoidal voltage, and a control device electrically connected to a DC voltage side of the modular multilevel current converter and configured to generate with the at least one submodule a square-wave voltage or a trapezoidal voltage having an alternating voltage component which is free of a direct voltage component and dimensioned in such a way that the time-averaged electrical energy absorbed by the modular brake actuator is converted into heat in the braking resistor wherein the braking resistor has a resistance value R selected to be small enough, such that the formula $$|i_{BR,aDC}| = \sqrt{\left(\frac{U_D}{R} - i_{BR,DC}\right) \cdot i_{BR,DC}}$$

provides a positive value.

15. The modular drive unit of claim 14, wherein an AC voltage side of the modular multilevel current converter is connected to an energy source.

16. The modular drive unit of claim 15, wherein the AC voltage side is connected to an energy supply network or to an electrical machine.

17. The modular drive unit of claim 14, wherein the control device is designed to determine a power that is to be converted into heat as a function of the voltage of the at least one capacitor of the at least one submodule.

* * * * *